US010447251B2

(12) United States Patent
Bagger (10) Patent No.: US 10,447,251 B2
(45) Date of Patent: Oct. 15, 2019

(54) POWER EFFICIENT HIGH SPEED LATCH CIRCUITS AND SYSTEMS (71) Applicant: Telefonaktiebolaget LM Ericsson (publ), Stockholm (SE)

(72) Inventor: Reza Bagger, Järfälla (SE)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 0 days.

(21) Appl. No.: 15/522,052

(22) PCT Filed: Dec. 2, 2015

(86) PCT No.: PCT/SE2015/051298
§ 371 (c)(1),
(2) Date: Apr. 26, 2017

(87) PCT Pub. No.: WO2016/089292
PCT Pub. Date: Jun. 9, 2016

(65) Prior Publication Data
US 2017/0324402 A1 Nov. 9, 2017

(30) Foreign Application Priority Data
Dec. 2, 2014 (WO) ................ PCT/SE2014/051430

(51) Int. Cl.
H03K 3/356 (2006.01)
H03K 3/3562 (2006.01)
(Continued)

(52) U.S. Cl.
CPC ....... H03K 3/356104 (2013.01); H03K 3/356 (2013.01); H03K 3/35625 (2013.01);
(Continued)

(58) Field of Classification Search
CPC ............ H03K 5/15; H03K 3/356; H03K 3/35; H03K 3/356104
See application file for complete search history.

(56) References Cited

U.S. PATENT DOCUMENTS 6,163,182 A 12/2000 Canard et al.
7,298,183 B2 11/2007 Mirzaei et al.
(Continued)

FOREIGN PATENT DOCUMENTS

WO 2007004181 A2 1/2007
WO 2011003101 A1 1/2011
WO 2013073268 A1 5/2013

OTHER PUBLICATIONS

Razavi, Behzad et al., "Design of High-Speed, Low-Power Frequency Dividers and Phase-Locked Loops in Deep Submicron CMOS," IEEE Journal of Solid-State Circuits, vol. 30, Issue 2, Feb. 1995, IEEE, pp. 101-109.

(Continued)

Primary Examiner — Hai L Nguyen
(74) Attorney, Agent, or Firm — Withrow & Terranova, PLLC (57) ABSTRACT The present invention relates to a combiner latch circuit for generation of one phase differential signal pair or two phase differential signal pairs. The combiner latch circuit comprises an input circuit configured to select a state of the output circuit from a group of: a fourth state comprising the differential output X=1, Y=0, a fifth state comprising the differential output X=0, Y=1. The input circuit is further configured to select the fourth state if the input A=0 and the input B=1 and the clock input encounter a leading edge from 0 to 1 and the output circuit is in the fifth state, and select the fifth state if the input A=1 and the input B=0 and the (Continued)

clock input encounter a leading edge from 0 to 1 and the output circuit is in the fourth state.

7 Claims, 11 Drawing Sheets

(51) Int. Cl.

| | |
|---|---|
| H03K 21/10 | (2006.01) |
| H03K 23/42 | (2006.01) |
| H03K 19/20 | (2006.01) |
| H04B 1/40 | (2015.01) |
| H03K 5/15 | (2006.01) |
| H03K 3/37 | (2006.01) |
| H03K 23/48 | (2006.01) |

(52) U.S. Cl.
CPC ......... *H03K 3/356139* (2013.01); *H03K 3/37* (2013.01); *H03K 5/15066* (2013.01); *H03K 19/20* (2013.01); *H03K 21/10* (2013.01); *H03K 23/425* (2013.01); *H04B 1/40* (2013.01); *H03K 23/483* (2013.01)

(56) References Cited

U.S. PATENT DOCUMENTS

| | | | |
|---|---|---|---|
| 7,336,114 B2 * | 2/2008 | Razavi | H03K 3/012 327/199 |
| 7,425,850 B2 | 9/2008 | Widerin | |
| 7,521,976 B1 | 4/2009 | Sudjian et al. | |
| 7,656,204 B2 * | 2/2010 | Henzler | H03K 3/012 327/115 |
| 8,203,367 B2 | 6/2012 | Leoncavallo | |
| 8,237,485 B2 | 8/2012 | Meng et al. | |
| 8,487,682 B2 | 7/2013 | Du et al. | |
| 10,177,748 B2 | 1/2019 | Bagger | |
| 2004/0012416 A1 | 1/2004 | Cheung et al. | |
| 2009/0068975 A1 | 3/2009 | Luong et al. | |
| 2011/0156786 A1 | 6/2011 | Yamaguchi | |
| 2011/0234266 A1 | 9/2011 | Tsai | |
| 2017/0244393 A1 | 8/2017 | Bagger | |

OTHER PUBLICATIONS

International Search Report and Written Opinion for International Patent Application No. PCT/SE2015/051298, dated Feb. 26, 2016, 10 pages.

Yuan, Jiren et al., "High-Speed CMOS Circuit Technique," IEEE Journal of Solid-State Circuits, vol. 24, Issue 1, Feb. 1989, IEEE, pp. 62-70.

Fabiano, I. et al., "Saw-Less Analag Front-End Receivers for TDD and FDD," 2013 IEEE International Solid-State circuits Conference, ISSCC 2013, Session 5, RF Techniques, 5.1, Feb. 18, 2013.

Magoon, R., et at. "RF Local Oscillator Path for GSM Direct Conversion Transceiver With True 50% Duty Cycle Divide by Three and Active Third Harmonic Cancellation," IEEE Radio Frequency Integrated Circuits Symposium, Jun. 17, 2002, Montreal, Canada, pp. 23-26.

Nejdel, A., et al., "A 0.7-3.7 GHz Six Phase Receiver Front-End With Third Order Harmonic Rejection," 2013 Proceedings of the 39th European Solid-State Circuits Conference, Sep. 16, 2013, Bucharest, Romania, pp. 279-282.

Zhou, C., et al., "A 50% duty cycle wide-locking range divide-by-3 divider up to 6 GHz," 2011 IEEE Radio Frequency Integrated Circuits Symposium (RFIC), Jul. 5, 2011, Baltimore, Maryland, pp. 1-4.

Notice of Allowance for U.S. Appl. No. 15/524,375, dated Sep. 7, 2018, 9 pages.

International Search Report and Written Opinion for International Patent Application No. PCT/SE2014/051430, dated Aug. 13, 2015, 18 pages.

Non-Final Office Action for U.S. Appl. No. 15/517,574, dated Jul. 6, 2018, 13 pages.

Notice of Allowance for U.S. Appl. No. 15/517,574, dated Dec. 10, 2018, 7 pages.

Corrected Notice of Allowability for U.S. Appl. No. 15/517,574, dated Jan. 11, 2019, 4 pages.

International Search Report and Written Opinion for International Patent Application No. PCT/SE2015/050489, dated Dec. 11, 2015, 10 pages.

* cited by examiner

POWER EFFICIENT HIGH SPEED LATCH CIRCUITS AND SYSTEMS

This application is a 35 U.S.C. § 371 national phase filing of International Application No. PCT/SE2015/051298, filed Dec. 2, 2015, which claims priority to International Application No. PCT/SE2014/051430, filed Dec. 2, 2014, the disclosures of which are incorporated herein by reference in their entireties.

TECHNICAL FIELD

The embodiments described herein relates to latch circuits and in particular to latch circuits for high speed applications and latching systems, such as divide-by-two latching systems.

BACKGROUND

High speed latches are in general important components of today's wireless transceivers utilizing digital radio and in particular essential in pulse generation and duty cycle control in telecommunications' applications.

An example of a high speed latch is disclosed in an article by Behzad Razavi et al., "Design of high-speed, low-power frequency dividers and phase-locked loops in deep submicron CMOS", IEEE journal of solid-state circuits, vol. 30, No. 2, February 1995.

A high frequency divider circuit is disclosed in WO2011/003101A1. This 50% duty cycle frequency divider utilizes a pair of latches, which uses a multi-bit digital controller for setting a variable resistance element. This variable resistance element provides a variable load and enables the reduction of the output resistance at higher frequencies.

The latches in WO2011/003101A1 have a major drawback, i.e. the operation functionality of the circuit depends on the output signal swing. That is to say, Vgs of the uppermost PMOS devices is determined by the output signal swing. Hence successive reduction of the output load seen by the circuit at higher frequencies could be perhaps a remedy to progressive shrinking of the signal swing with frequency.

SUMMARY

It is an objective to provide a circuit and a system which improves the speed, power efficiency and bandwidth of latching circuit and systems for high speed applications.

The above stated objective is achieved by means of a combiner latch circuit and a latching system according to the independent claims.

A first embodiment provides a combiner latch circuit, comprising an input circuit with an input A, an input B, a clock input CLK, and a clock input $\overline{CLK}$, an output circuit with a differential output X, Y wherein the input circuit is connected to the output circuit, and configured to select a state of the output circuit from the group of: a fourth state comprising the differential output X=1, Y=0 of the differential output X, Y a fifth state comprising the differential output X=0, Y=1 of the differential output X, Y wherein the input circuit is further configured to: select the fourth state if the input A=0 and the input B=1 and the clock input CLK encounter a leading edge from 0 to 1 and the output circuit is in the fifth state, select the fifth state if the input A=1 and the input B=0 and the clock input CLK encounter a leading edge from 0 to 1 and the output circuit is in the fourth state.

A second embodiment provides a latching system for a divide-by-two function, comprising a first combiner latch circuit according to the first embodiment, and a four-phase generator having a first phase output, a second phase output, a third phase output, and a fourth phase output. The four-phase generator further comprises a differential clock signal input, wherein the input A of the first combiner latch circuit is connected to the fourth phase output of the four-phase generator, wherein the input B of the first combiner latch circuit is connected to the third phase output of the four-phase generator, and a differential clock signal is connected to the corresponding clock signal inputs of the first combiner latch circuit and the four-phase generator, respectively, whereby a divide-by-two function is provided.

An advantage of certain embodiments described herein is that they provide minimal functional dependency on the output signal swing as well with minimal functional dependency on the output load variations with frequency.

An advantage of certain embodiments described herein is that they make it possible to achieve a divide-by-two function with relatively few components.

Another advantage of some embodiments described herein is that they can provide faster latching circuits and systems.

Reduced power consumption is another consequence of the relatively small active device periphery used to accomplish the functionality with no direct signal path from VDD to GND under any time events.

Further advantages and features of embodiments of the present invention will become apparent when reading the following detailed description in conjunction with the drawings.

DETAILED DESCRIPTION

The present invention will now be described more detailed hereinafter with reference to the accompanying drawings, in which different exemplary embodiments are shown. These exemplary embodiments are provided so that this disclosure will be thorough and complete and not for purposes of limitation.

In this disclosure the definition of logical levels should be interpreted as follows: A low level should be interpreted as a voltage level indicating a value of 0 or logical low. A high level should be interpreted as a voltage level indicating a value of 1 or logical high.

The meaning of the terms X=1, Y=0 and A=1 as used herein are as follows. X=1 should be interpreted as a logical high voltage level on terminal X. Accordingly, Y=0 should be interpreted as a logical low voltage level on terminal Y.

The meaning of a leading edge and trailing edge as used herein are as follows. A leading edge on X indicates a shift from 0 to 1, and a trailing edge on Y indicates a shift from 1 to 0, wherein 1 indicates high voltage level and 0 indicates low voltage level. In the following, different aspects will be described in more detail with references to certain embodiments and to accompanying drawings. For purposes of explanation and not limitation and in order to provide a thorough understanding of the different embodiments, then specific details are set forth, such as particular scenarios and techniques. However, other embodiments that depart from these specific details may also exist.

Figure 1:
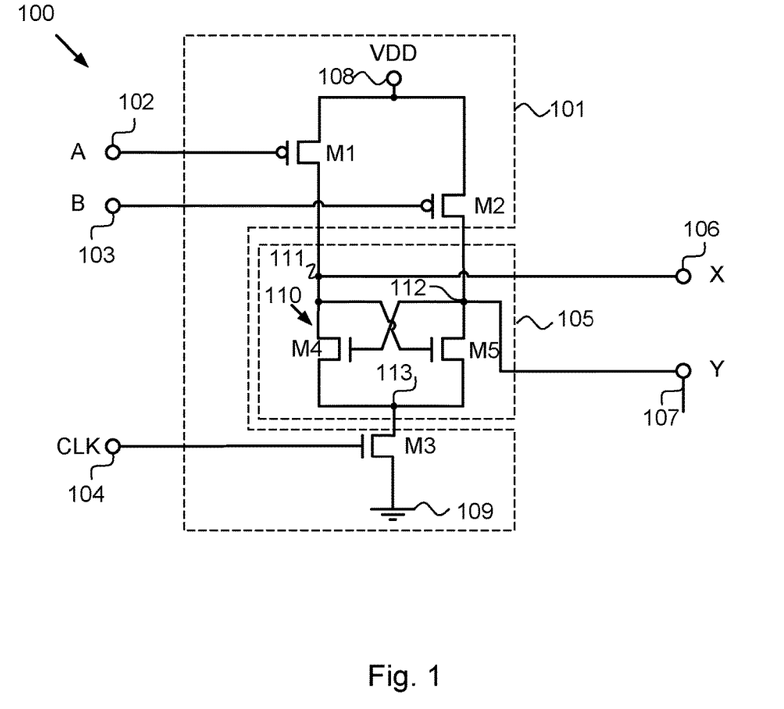
FIG. 1 is a circuit diagram of an electronic latch circuit according to embodiments.

FIG. 1 is a circuit diagram of a latch circuit, generally designated 100, according to one embodiment. The latch circuit 100 comprises an input circuit 101 and an output circuit 105. The input circuit 101 comprises an input A 102, and an input B 103 for receiving signals comprising low levels or high levels from connectable external circuits. The input circuit 101 further comprises a clock signal input 104 configured to receive a clock signal from an external clock circuitry. The clock signal provides alternating states between the low level and the high level at a predetermined frequency and duration.

The input circuit 101 further comprises a first MOS transistor (M1) with a gate connected to the input A. A gate of a second MOS transistor (M2) is connected to the input B. A source of the first MOS transistor and source of the second MOS transistor are connected to a supply voltage (108), VDD. Finally, a drain of the first MOS transistor is connected to a first node 111 of the output circuit, and a drain of the second MOS transistor is connected a second node 112 of the output circuit.

In this embodiment, the first and the second MOS transistors may be PMOS transistors.

The input circuit further comprises a third MOS transistor (M3) with a gate connected to the clock signal input 104, a source connected to a second voltage potential (109), and a drain connected to a third node 113 of the output circuit.

The second voltage may in one embodiment be a ground potential. The second voltage may in another embodiment be a potential lower than the supply voltage 108.

The output circuit may further comprise a regenerative device 110 connected to the first node 111 and to the output X 106, the regenerative device is further connected to the second node 112 and to the output Y 107, the latch circuit further comprises a third node 113 connected to the input circuit 101.

The regenerative device 110 comprise a fourth MOS transistor M4 with a drain connected to the first node 111, a gate connected to the second node 112, and a source connected to the third node 113. The regenerative device further comprises a fifth MOS transistor M5 with a drain connected to the second node 112, a gate connected to the first node 111, and a source connected to the third node 113. The third MOS transistor M3, the fourth MOS transistor M4, and the fifth MOS transistor M5 may be NMOS transistors.

The function of the electronic latch circuit 100 will now be discussed with reference made to FIG. 2 in order to fully disclose the operation of the electronic latch circuit 100 according to FIG. 1.

Figure 2:
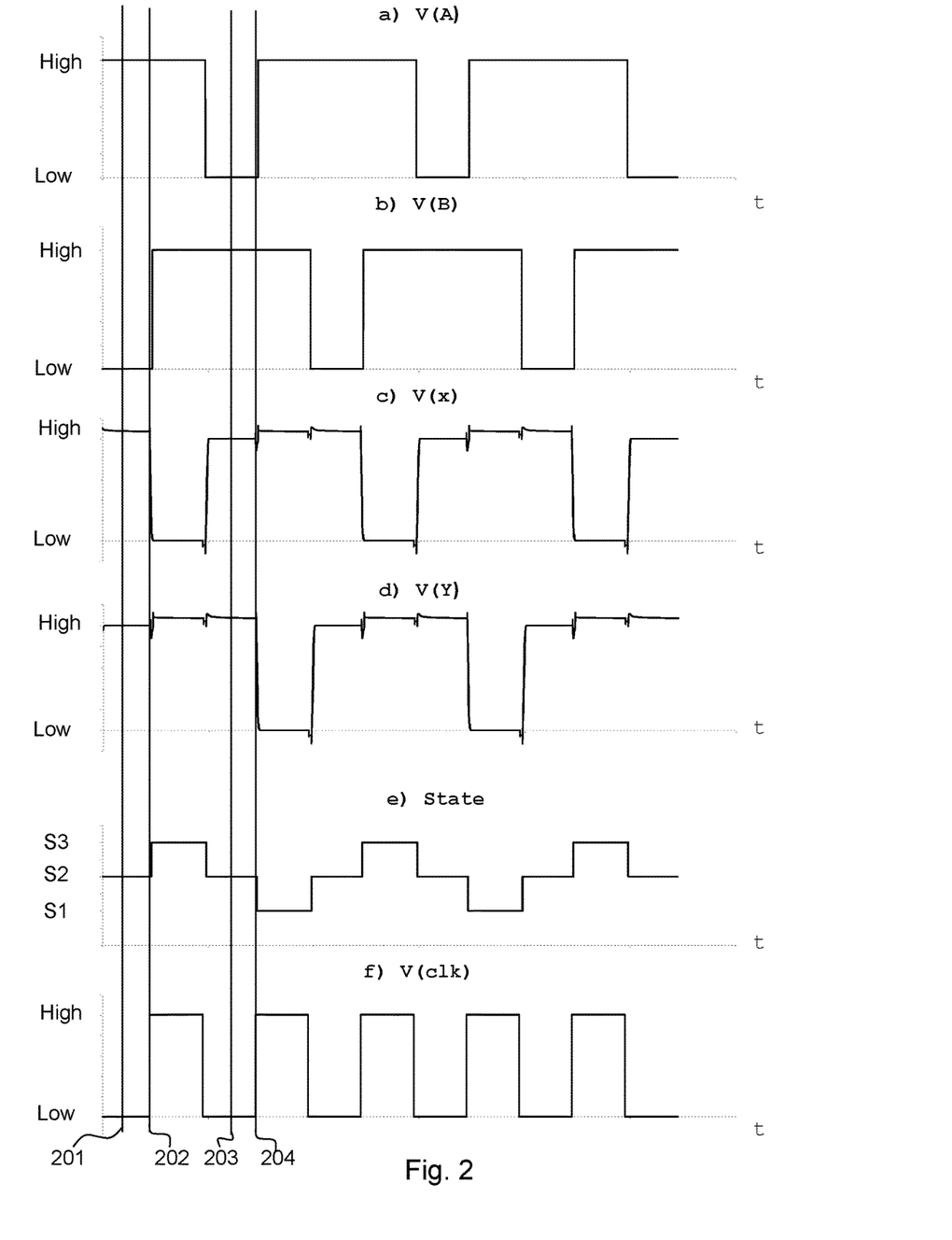
FIG. 2 is a graph illustrating the different signals of an electronic latch circuit according to embodiments.

FIG. 2 illustrates a Spice simulation of the electronic latch circuit 100. The stimuli to the electronic latch circuit 100 in the Spice simulation consists of a clock signal, illustrated in FIG. 2f) connected to the clock signal input 104. Furthermore, the stimuli to the electronic latch circuit 100 further consists of two pulse generators connected to input A 102 and input B 103, respectively. The pulse train signals from these two pulse generators are illustrated in FIG. 2a) and FIG. 2b), respectively. The output X 106 and the output Y 107 from the electronic latch circuit 100, are shown in FIG. 2c) V(X) and FIG. 2d) V(Y). FIG. 2e) is a signal derived from the inputs A 102, B 103 and the outputs X 106 and Y 107, this signal indicates states of the electronic latch circuit 100, i.e. S1, S2 or S3 based on the inputs A 102, B 103 and the outputs X 106 and Y 107. These states will later be discussed with reference made to FIG. 3. The horizontal axes of FIG. 2 are time axes and the corresponding vertical axes indicate voltages between a low voltage indicating a low level and a high voltage indicating a high level.

In order to provide a concise description, it is convenient to introduce a shorthand notation for the signals of the electronic latch circuit 100 as follows. A=0 means that input A 102 is at a low level, indicating a logical 0. A=1 means that input A 102 is at a high level, indicating a logical 1. Hence, CLK=0 should be interpreted as a low on the clock signal input 104, indicating a logical 0. X=1 should be interpreted as a high on the output X 106, etc. A transition from A=0 to A=1 is indicated by A=0|1. The Boolean operator AND is written as '&'. Thus, A=0 & B=1 indicates simultaneous occurrence of a low level on input A 102 and a high level on input B 103.

At a first time t=t1 (201), indicated with a vertical line through the sub plots of FIG. 2, the electronic latch circuit 100 is in a second state S2 (X=1 and Y=1), which can be seen in FIG. 2e). Furthermore, A=1 and B=0, which causes the first MOS transistor M1 to be off, and the second MOS transistor M2 to be on, and CLK=0 which causes the third MOS transistor M3 to be off. This condition pulls up the node 112.

At a second time t=t2 (202) the electronic latch circuit 100 changes state from the second state S2 (X=1 and Y=1) to a third state S3 (X=0 and Y=1) at the rising edge of the transition, CLK=0|1. At the rising edge of the clock signal the regenerate device 110 turns on. The circumstances of the signals A=1 and B=0 increase the probability for the regenerative device 110 to tilt towards pulling down 111, which gives X=0 and accordingly Y=1, as can be seen in FIG. 2c). Consequently the electronic latch circuit 100 changes state from the second state S2 to the third state S3.

At a third time t=t3 (203) the electronic latch circuit 100 change state from the third state S3 to the second state S2.

This change of state is initiated upon a falling edge of CLK=1|0, which turns off the third MOS transistor M3. The input A=0 which causes the first MOS transistor M1 turns on, which in turn causes a high state on the first node 111 and on the output X.

At a fourth time t=t4 (204) the electronic latch circuit 100 changes state from the second state S2 to the first state S1, at the rising edge of the transition from CLK=0|1. At the rising edge of the clock the regenerate device 110 will turn on. The circumstances of the signals A=0 and B=1 increase the probability for the regenerative device to tilt towards pulling down 112, Y=0 and hence X=1, as can be seen in FIG. 2d). Consequently the electronic latch circuit 100 changes state from the second state S2 to the first state S1.

Figure 3:
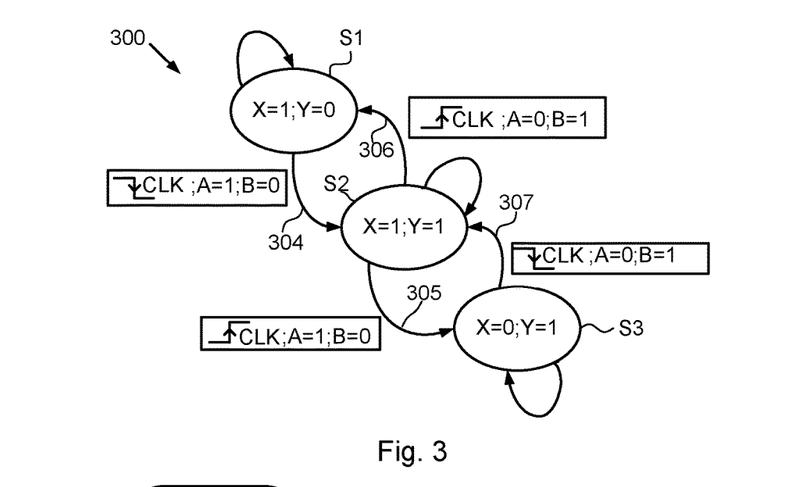
FIG. 3 is a state diagram illustrating a method according to embodiments.

It is possible to define a state machine from the inner workings of the electronic latch circuit 100. A state machine is generally described with a state diagram as shown in FIG. 3, designated 300. This state diagram 300 defines three different states for the output circuit 105, of the electronic latch circuit 100, from the group of:

A first state S1, comprising output of a low state at the output Y 107, and output of a high state at the output X 106.

A second state S2, comprising output of a high state at the output X 106 and at the output Y 107.

A third state S3, comprising output of a high state at the output Y 107, and output of a low state at the output X 106;

Each of these states is illustrated as ellipses in FIG. 3.

The transition from a state to another state is controlled by the input signals to the input circuit 101 as well as by the present state of the output circuit 105. The electronic latch circuit 100 is configured to:

Select 306 the first state S1 upon detecting a transition on the clock signal input 104 from a low level to a high level, a high level on the input B 103, a low level on the input A 102, and the output circuit 105 is in the second state S2. This condition can be expressed as CLK=0|1 & B=1 & A=0 & State=S2 using the above defined short-hand notation.

Select 304 the second state S2 upon detecting a high level on the input A 102, a low level on the input B 103, a low level on the clock signal input 104, and that the output circuit 105 is in the first state S1. Which is denoted A=1 & CLK=0 & B=0 & State=S1 using the short-hand notation.

Select 305 the third state S3 upon detecting a transition on the clock signal input 104 from a low level to a high level, a high level on the input A 102, and a low level on the input B 103, and that the output circuit 105 is in the second state S2. Which is denoted A=1 & CLK=0|1 & B=0 & State=S2.

Select 307 the second state S2 upon detecting a high level on the input B 103, a low level on the input A 102, and low level on the clock signal input 104 and that the output circuit 105 is in the third state S3. Which is denoted A=0 & CLK=0 & B=1 & State=S3.

Figure 4:
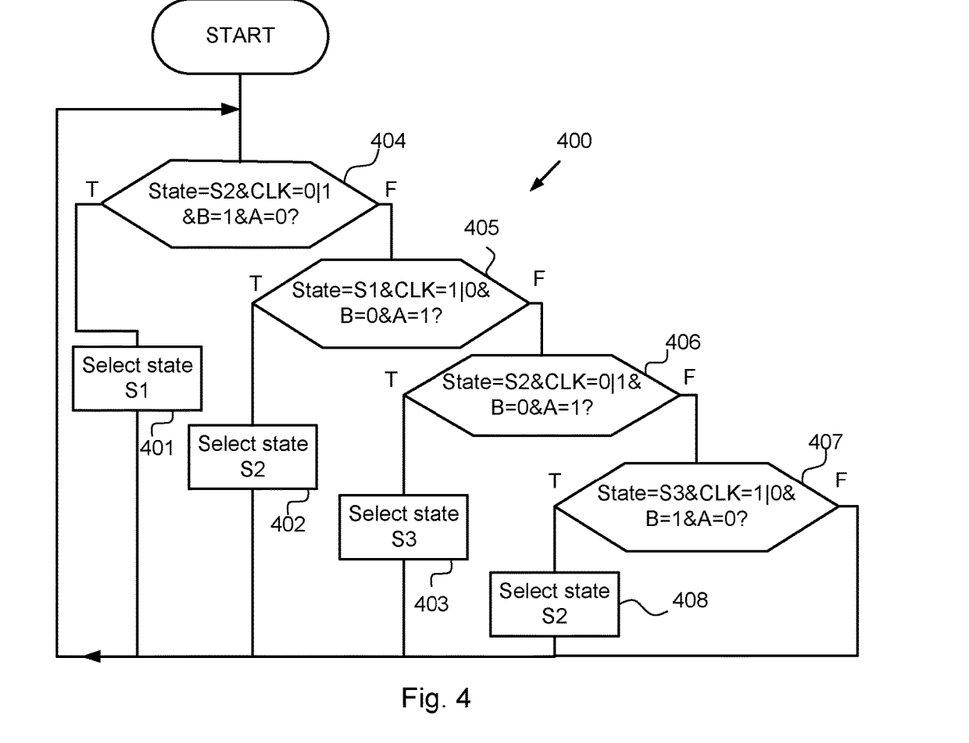
FIG. 4 is a flow chart illustrating a method according to embodiments.

The state diagram 300 may be transformed into a corresponding flow chart shown in FIG. 4, and commonly designated 400. This flowchart discloses a method for an electronic latch circuit 100.

The method comprises:

401: Select the first state S1 upon detecting 404 a high level on the input B 103, a low level on the input A 102, a transition of the clock signal input 104 from a low level to a high level, and that the electronic latch circuit 100 is in the second state S2.

402: Select the second state S2 upon detecting 405 a high level on the input A 102, a low level on the clock signal input 104, a low level on the input B 103, and that the electronic latch circuit 100 is in the first state S1.

403: Select the third state S3 upon detecting 406 a high level on the input A 102, a transition of the clock signal input 104 from a low level to a high level, a low level on the input B 103, and that the electronic latch circuit 100 is in the second state S2.

408: Select the second state S2 upon detecting 407 a high level on the input B 103, a low level on the input A 102, low level on the clock signal input 104, and that the electronic latch circuit 100 is in the third state S3.

Figure 5:
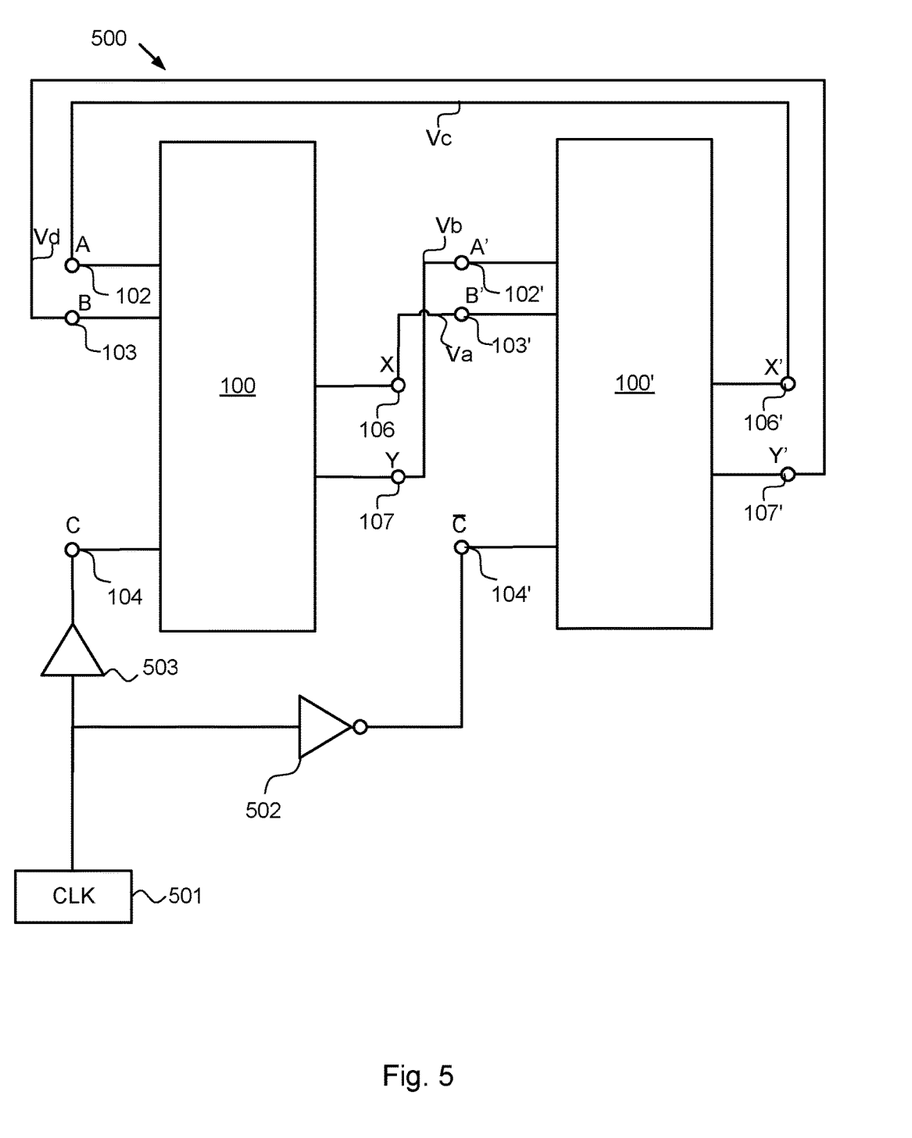
FIG. 5 is a circuit diagram of a four phase 25% duty cycle generator according to embodiments.

In FIG. 5 one embodiment of a 4-phase generator is disclosed, the 4-phase generator is commonly designated 500. The 4-phase generator 500 comprises a first and a second electronic latch circuit 100, 100' according to embodiments of an electronic latch circuit 100.

The clock signals input 104 of the first electronic latch circuit 100 is configured to be connected to a clock generator 501 via a transmission gate 503.

The clock generator 501 is further connected to the clock signal input 104' of the second electronic latch circuit 100' via an inverter 502.

The transmission gate 503 and the inverter 502 may be configured to introduce a delay of the same length to the clock signal. This causes the outputs from the inverter and the transmission gate to be 180 degrees out of phase.

But, the clock signal input 104' of the second electronic latch circuit 100' may of course also be connected to a second clock generator configured to generate a clock signal that is 180 degrees out of phase with respect to the clock generator 501.

The input A 102 of the first electronic latch circuit 100 is connected to the output X' 106' of the second electronic latch circuit 100'.

The input B 103 of the first electronic latch circuit 100 is connected to the output Y' 107' of the second electronic latch 100'.

The input A' 102' of the second electronic latch circuit 100' is connected to the output Y 107 of the first electronic latch circuit 100, and the input B' 103' of the second electronic latch circuit 100' is connected to the output X 106 of the first electronic latch.

This 4-phase generator 500 provides a first phase signal Va at the output X of the first electronic latch circuit 100, a second phase signal Vb at the output Y of the first electronic latch circuit, a third phase signal Vc is provided at the output X' of the second electronic latch circuit, and a fourth phase signal Vd is provided at the output Y' of the second electronic latch circuit.

Another embodiment of a 4-phase generator may be obtained by modifying the first embodiment of a 4-phase generator disclosed above. This modification involves connecting the input A' to output X, the input B' to output Y, the output X' to input B, and output Y' to input A. The primed inputs and outputs belongs to the second electronic latch circuit 100', and the un-primed inputs and outputs belongs to the first electronic latch circuit 100.

Figure 6:
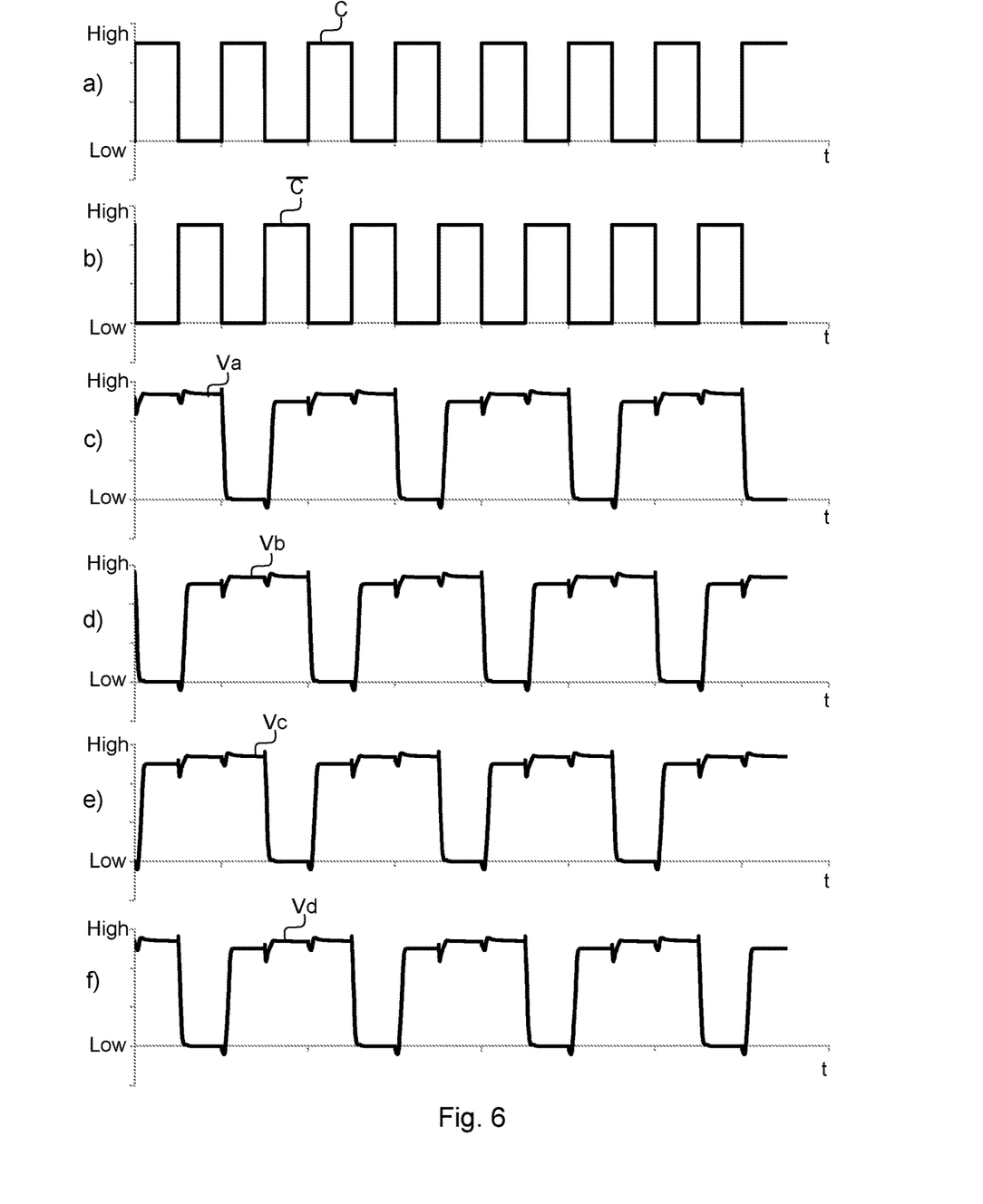
FIG. 6 is a graph illustrating the different signals of a four phase 25% duty cycle generator according to embodiments.

In FIG. 6 the four phase 25% duty cycle signals are shown as outputs from a SPICE simulation of the embodiment of a 4-phase generator disclosed with reference made to FIG. 5.

FIG. 6a) shows the clock signal connected to the clock signal input 104 of the first electronic latch circuit 100. FIG. 6b) shows the clock signal connected to the clock signal input 104' of the second electronic latch circuit 100'. This clock signal is the inverse of the clock signal connected to the clock signal input 104 of the first electronic latch circuit 100. FIG. 6c) shows the first phase signal Va. FIG. 6d) shows the second phase signal Vb. FIG. 6e) shows the third phase signal Vc. FIG. 6f) shows the fourth phase signal Vd.

The 4-phase generator according to embodiments may provide four phase signals at a higher clock frequency compared to other 4-phase generators for a given generation of transistors with a minimum gate length.

The 4-phase generator according to embodiments may provide a more efficient solution that requires less power due to the smaller total transistor periphery used in the electronic latch circuit 100 compared to the prior art.

Figure 7:
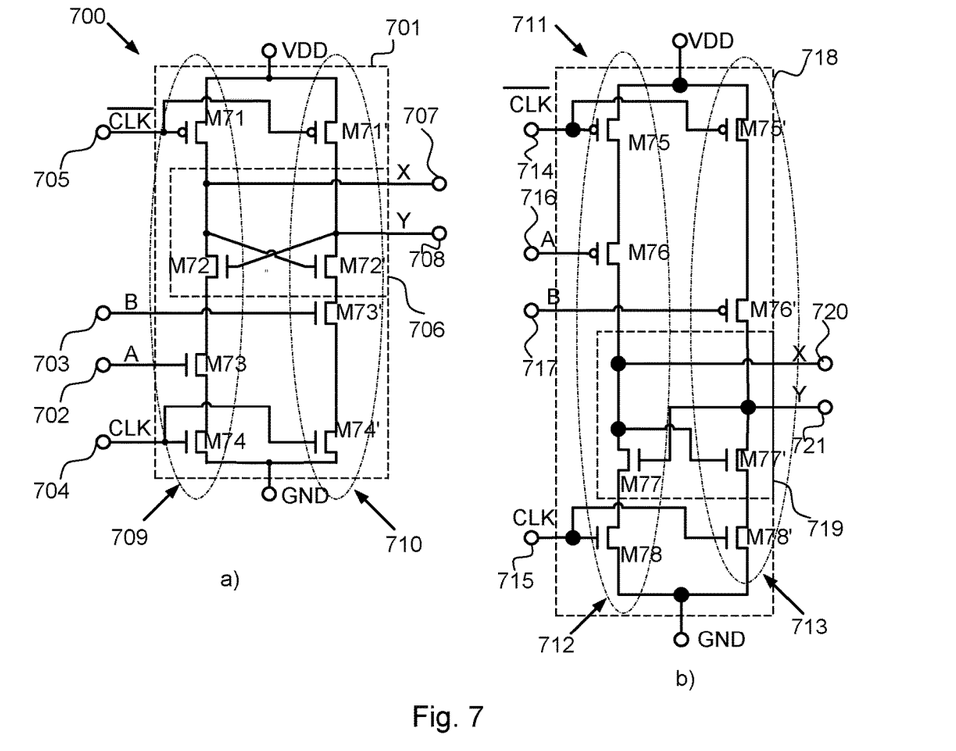
FIG. 7 is a schematic circuit diagram of a combiner latch according to embodiments.

FIG. 7a illustrates an embodiment of a combiner latch, generally designated 700.

The combiner latch 700 comprises a first branch 709 and a second branch 710 connected in parallel between a supply voltage VDD terminal and a ground terminal GND, wherein each of the first branch 709 and the second branch 710 comprises a PMOS transistor M71, M71' having a gate connected to a terminal for an inverted clock signal $\overline{CLK}$ 705, and a drain connected to the supply voltage terminal VDD. The first branch 709 and the second branch 710 further comprises a first NMOS transistor M72, M72' arranged downstream the PMOS transistor M71, M71', a second NMOS transistor M73, M73' arranged downstream the first NMOS transistor, and a third NMOS transistor M74, M74' arranged downstream the second NMOS transistor with a source thereof connected to the ground terminal, and a gate connected to a terminal for a clock signal CLK 704. The combiner latch circuit 700 further comprises a first terminal A 702 connected to the gate of the second NMOS transistor M73 of the first branch 709, a second terminal B 703 connected to a gate of the second NMOS transistor M73' of the second branch 710. The combiner latch circuit further involves a cross-coupling of the first NMOS transistors M72, M72' of the first branch 709 and the second branch 710, wherein a gate of the first NMOS transistor M72 of the first branch connected to the drain of the first NMOS transistor M72' of the second branch, and a gate of the first NMOS transistor M72' of the second branch is connected to the drain of the first NMOS transistor M72 of the first branch. Furthermore, an input circuit 701 comprises the PMOS transistors M71, M71', the second NMOS transistors M73, M73', and the third NMOS transistors M74, M74' of the first branch 709 and the second branch 710. An output circuit 706 comprises the cross-coupled first NMOS transistors M72, M72' and the differential output terminals X, Y 707, 708 connected to a drain of the first NMOS transistor M72, M72' of the first branch and the second branch, respectively.

In one embodiment may each of the first branch 709 and the second branch 710 have a source of the second NMOS transistor M73,M73' directly connected to the ground terminal GND. This means that the third NMOS transistor M74, M74' becomes unnecessary, and may be omitted.

FIG. 7b illustrates an embodiment of a combiner latch, generally designated 711.

This combiner latch 711 is a complementary design to the combiner latch 700 disclosed with reference made to FIG. 7a. The combiner latch 711 comprises a first branch 712 and a second branch 713 connected in parallel between a supply voltage VDD terminal and a ground terminal GND, wherein each of the first branch 712 and the second branch 713 comprises a first PMOS transistor M75, M75' having a gate connected to a terminal for an inverted clock signal $\overline{CLK}$ 714, and a source connected to the supply voltage terminal VDD. The first branch 712 and the second branch 713 further comprises a second PMOS transistor M76, M76' arranged downstream the first PMOS transistor M75, M75', a first NMOS transistor M77, M77' arranged downstream the second PMOS transistor, and a second NMOS transistor M78, M78' arranged downstream the first NMOS transistor with a source thereof connected to the ground terminal GND, and a gate connected to a terminal for a clock signal CLK 715. The combiner latch circuit 711 further comprises a first terminal A 716 connected to the gate of the second PMOS transistor M76 of the first branch 712, a second terminal B 717 connected to a gate of the second PMOS transistor M76' of the second branch 713. The combiner latch circuit 711 further involves a cross-coupling of the first NMOS transistors M77, M77' of the first branch 712 and the second branch 713, wherein a gate of the first NMOS transistor M77 of the first branch being connected to the drain of the first NMOS transistor M77' of the second branch, and a gate of the first NMOS transistor M77' of the second branch is connected to the drain of the first NMOS transistor M77 of the first branch. Furthermore, an input circuit 718 comprises the first PMOS transistors M75, M75', the second PMOS transistors M76, M76', and the second NMOS transistors M78, M78' of the first branch 712 and the second branch 713. An output circuit 719 comprises the cross-coupled first NMOS transistors M77, M77' and the differential output terminals X, Y 720, 721 connected to a drain of the first NMOS transistor M77, M77' of the first branch and the second branch, respectively.

In one embodiment may each of the first branch 712 and the second branch 713 have a drain of the second PMOS transistor M76,M76' directly connected to the supply voltage terminal VDD. This means that the first PMOS transistor M75, M75' becomes unnecessary, and may be omitted.

Figure 8:
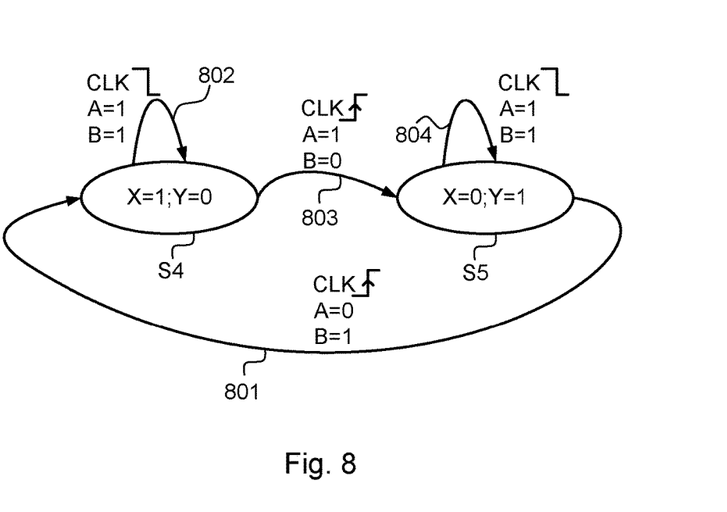
FIG. 8 is a state diagram illustrating an embodiment of a combiner latch.

The function of the combiner latch illustrated in FIG. 7a or FIG. 7b is now described with reference made to FIG. 8, which is a state diagram illustrating the different states of the combiner latch and the corresponding conditions for state changes.

As disclosed with reference made to FIG. 7 the combiner latch circuit 700,711 comprises the input circuit 701, 718 with the input A 702, 716 the input B 703, 717, a clock input CLK 704, 715, and an inverted clock input $\overline{CLK}$ 705, 714. Thus, the clock input CLK and the inverted clock input $\overline{CLK}$ forms a differential clock input.

Furthermore the combiner latch circuit further comprises the output circuit 706, 719 with a differential output X, Y 707,720, 708, 721. The input circuit 701, 718 is connected to the output circuit 706, 719, and configured to select a state of the output circuit 706, 719 from the group of: A fourth state S4 comprising the differential output X=1, Y=0 of X, Y 707, 720, 708, 721.

A fifth state S5 comprising the differential output X=0, Y=1 of X, Y 707, 720, 708, 721.

The input circuit 701, 718 is further configured to select 801, the fourth state S4 if the input A=0 and the input B=1 and the clock input CLK 704, 715 encounter a leading edge from 0 to 1 and the output circuit is in the fifth state S5.

The input circuit 701, 718 is further configured to select 803, the fifth state S5 if the input A=1 and the input B=0 and the clock input CLK 704, 715 encounter a leading edge from 0 to 1 and the output circuit is in the fourth state S4.

If the output circuit is in the fourth state S4 or the fifth state S5 and a trailing edge is encountered on the clock input CLK and A=1 and B=1 the output circuit remains in its current state. This is illustrated in FIG. 8 as transitions 802 and 804.

Figure 9:
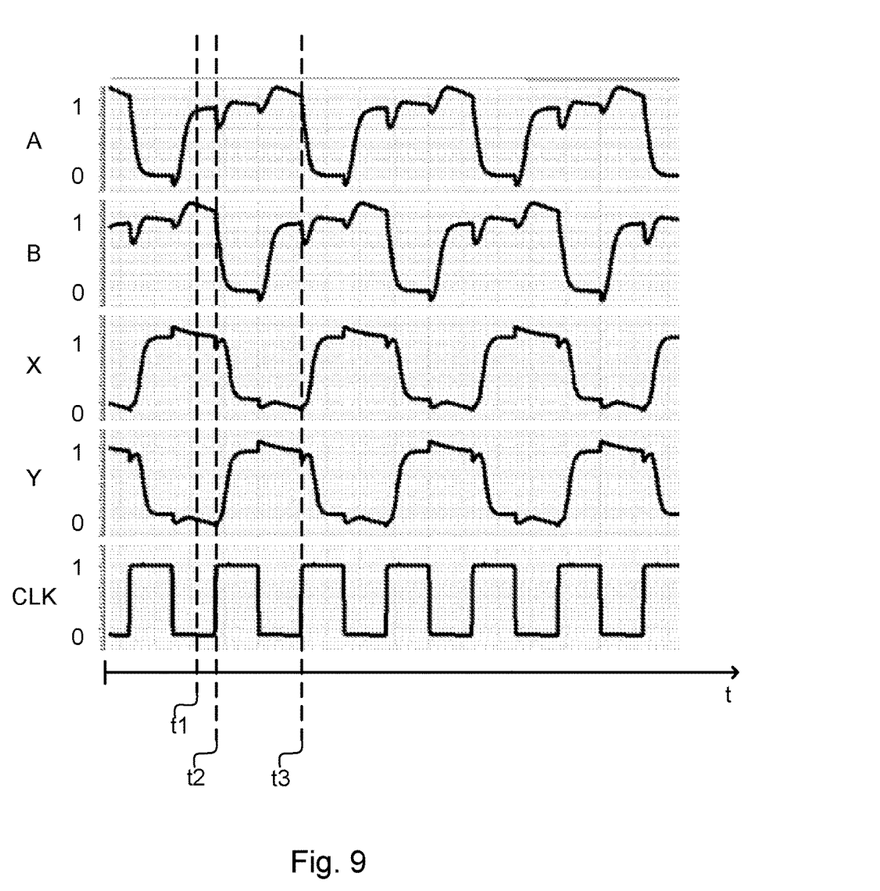
FIG. 9 is a graph illustrating time events over the outputs and the inputs to the combiner latch.

Now with reference made to FIG. 9, which is a Spice simulation of the combiner latch according to an embodiment, the function of the combiner latch will be discussed. FIG. 9 shows time events of the inputs A and B as well as the outputs X and Y. At a first time t1 the input circuit has CLK=0, A=1, B=1 which causes no change of the output circuit X=1 and Y=0. At a later time t2 the CLK has a leading edge and the A=1 and B=0 which is a condition for a transfer from the fourth state S4 to the fifth state S5 according to the state diagram in FIG. 8. This means that the output circuit X=0 and Y=1. At a later time t3 after the time t2 the CLK once again has a leading edge and A=0 and B=1, which causes the output circuit to change state from the fifth state S5 to the fourth state S4, X=1 and Y=0.

Figure 10:
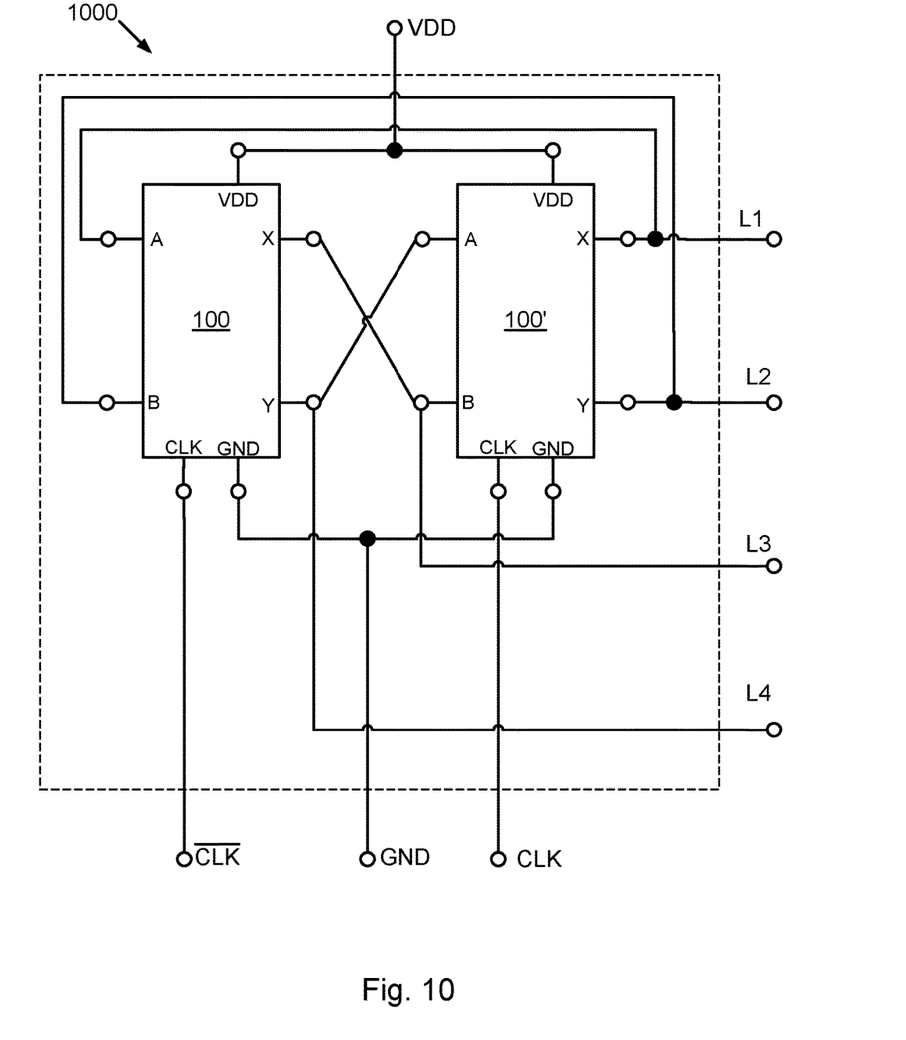
FIG. 10 is a circuit diagram of a four phase 25% duty cycle generator according to embodiments.

FIG. 10 is a circuit diagram of a four-phase generator similar to the four-phase generator disclosed with reference made to FIG. 5 except for the differential clock input CLK, $\overline{CLK}$ as used in the embodiment disclosed in FIG. 10. The differential clock input obviates the need for the inverter 502 and the transmission gate 503 in the embodiment disclosed with reference made to FIG. 5.

Figure 11:
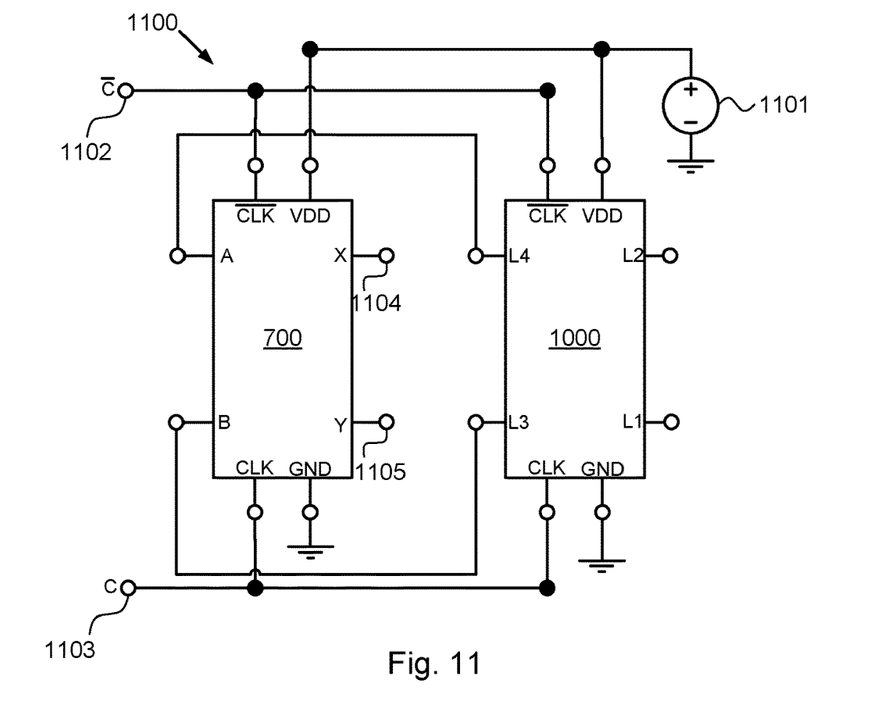
FIG. 11 is a circuit diagram of a latch system comprising a four phase 25% duty cycle generator and a combiner latch according to embodiments.

FIG. 11 shows a 50% duty cycle and one phase generator using latching system 1100 with divide-by-two function. The latching system comprises a first combiner latch circuit 700 according to an embodiment, and a 25% four-phase generator 1000 according to embodiments, having a first phase output (L1), a second phase output (L2), a third phase output (L3), and a fourth phase output (L4), in which the phase relation between (L1) relative (L2) and (L3) relative (L4) is depicted as the input signals A and B in FIG. 9. The four-phase generator further comprises a differential clock signal input (CLK, $\overline{CLK}$). The input A of the first combiner latch circuit 700 is connected to the fourth phase output (L4) of the four-phase generator 1000, the input B of the first combiner latch circuit is connected to the third phase output (L3) of the four-phase generator, and a differential clock signal (C, $\overline{C}$) is connected to the corresponding clock signal inputs of the first combiner latch circuit and the four-phase generator, respectively.

In one embodiment the latching system 1100 comprises a combiner latch 711 according to FIG. 7b instead of the combiner latch 700 according to FIG. 7a.

This latching system provides a divide-by-two function and a differential output at output X 1104 and Y 1105 of the first combiner latch circuit 700. Furthermore, a power supply 1101 is connected to corresponding power terminals of the combiner latching circuit 700 and the four-phase generator 1000. Ground terminals are also provided to the combiner latch circuit 700 and the four-phase generator 1000.

Figure 12:
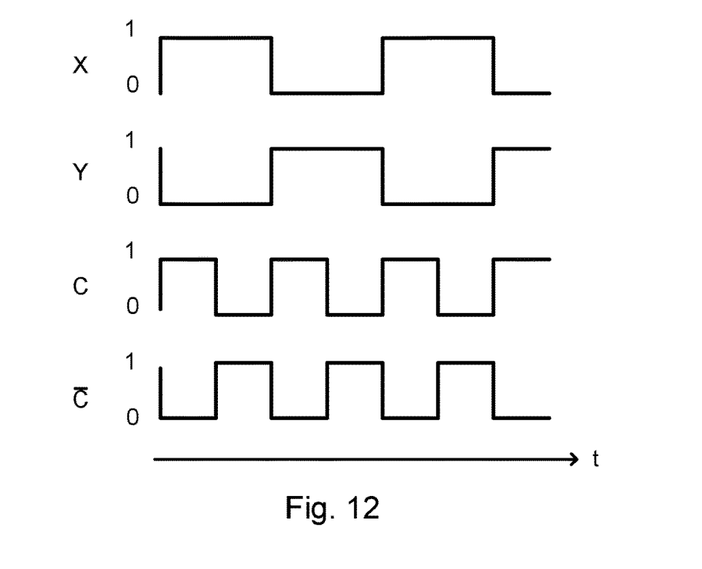
FIG. 12 is a graph illustrating time events over the signals involved in the latch system disclosed in FIG. 11.

FIG. 12 illustrates the divide-by-two function of the latching system 1100 disclosed in FIG. 11. A differential clock signal is formed by C and $\overline{C}$ 1102, 1103 which drives the latching system 1100. The output X 1104 of the combiner latch circuit 700 shows a corresponding signal in FIG. 12, which is the differential clock signal C divided by two. The complementary output Y 1105 is also shown in FIG. 12 together with the inverted clock signal $\overline{C}$.

Figure 13:
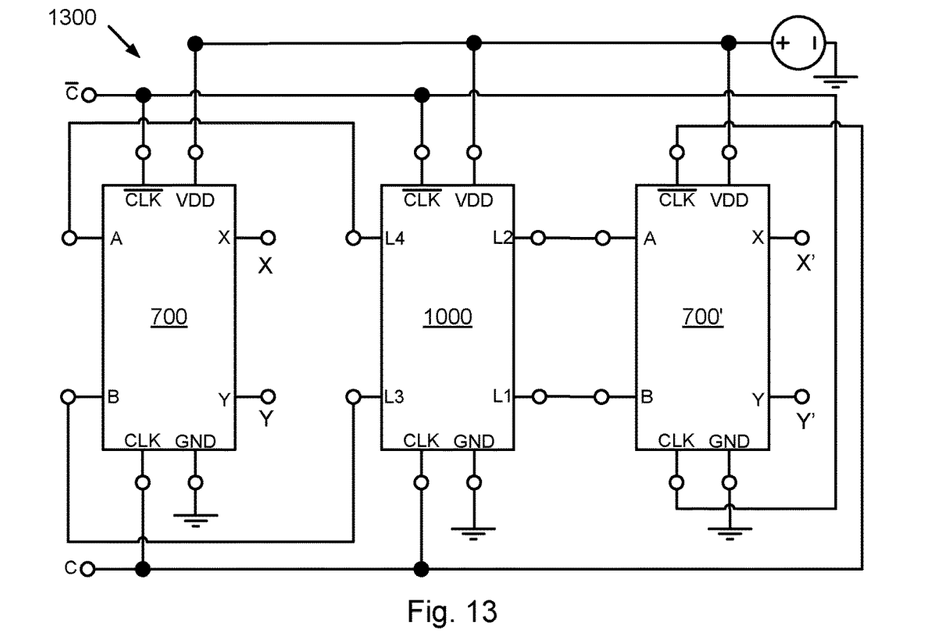
FIG. 13 is a circuit diagram of a latch system comprising a first and a second combiner latch and a four phase 25% duty cycle generator according to embodiments.
Figure 14:
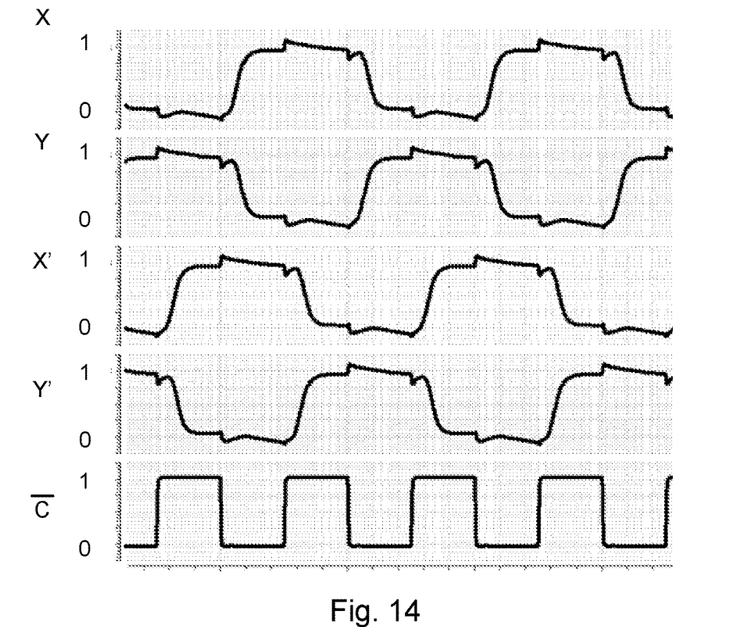
FIG. 14 is a graph illustrating time events over the signals involved in the latch system disclosed in FIG. 13.

FIG. 13 shows an embodiment of a modified latch system 1300 which comprises a further second combiner latch circuit 700' according to embodiments, compared to the latch system 1100 disclosed with reference made to FIG. 11. The second combiner latch circuit 700' having an input B connected to the first phase output L1 of the four-phase generator 1000, and an input A connected to the second phase output L2 of the four-phase generator 1000. This modified latch system provides a divide-by-two, four-phase signal at the output X and output Y of the first combiner latch circuit 700, and at the output X' and Y' of the second combiner latch circuit 700'. These signals are further disclosed in FIG. 14 which shows corresponding Spice simulations for the modified latching system 1300.

In one embodiment the modified latching system 1300 comprises combiner latches 711 according to FIG. 7b instead of the combiner latch 700, 700' according to FIG. 7a.

Figure 15:
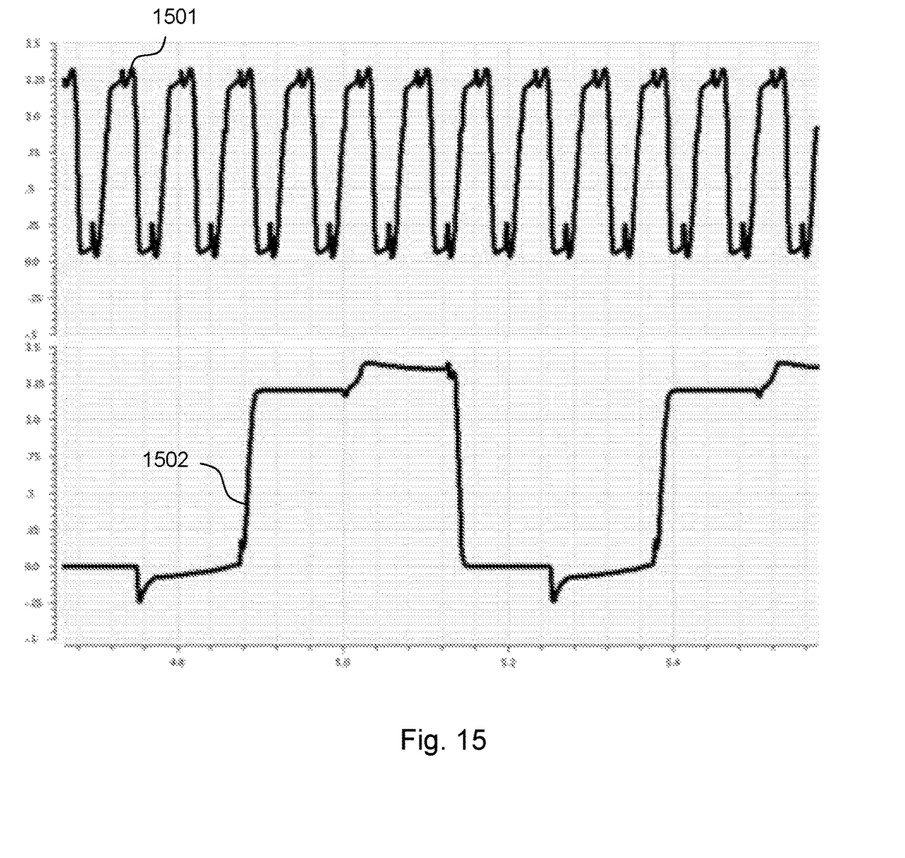
FIG. 15 is a graph illustrating the signal swing response of the circuit enclosed in the present invention for two clock frequencies at 4 GHz and 28 GHz.

A simulation of the latch system according to embodiments in FIG. 11 or FIG. 13 is disclosed in FIG. 15, which highlights some advantages of embodiments of this disclosure. The performance comprising a simulation in a 65 nm semiconductor process with VDD=1.2 V which indicates the rail to rail output signal swing without load adjustment seen by the combiner latches, at clock frequencies of 4 GHz 1502 and 28 GHz 1501. It is evident that the output signal swing of the embodiments of this disclosure is nearly constant over frequency.

In the drawings and specification, there have been disclosed typical embodiments and, although specific terms are employed, they are used in a generic and descriptive sense only and not for purposes of limitation, the scope of the invention being set forth in the following claims.

The invention claimed is:

1. A combiner latch circuit, comprising:
   an input circuit with a first input, a second input, a clock input, and an inverted clock input;
   an output circuit with a first differential output and a second differential output;
   wherein the input circuit is connected to the output circuit, and configured to select a state of the output circuit from the group of:
      a fourth state comprising the first differential output being at logic 1 and the second differential output being at logic 0; and
      a fifth state comprising the first differential output being at logic 0 and the second differential output being at logic 1; and
   wherein the input circuit is further configured to:
      select the fourth state when the first input is at logic 0 and the second input is at logic 1 and the clock input encounters a leading edge from logic 0 to logic 1 and the output circuit is in the fifth state; and
      select the fifth state when the first input is at logic 1 and the second input is at logic 0 and the clock input encounters a leading edge from logic 0 to logic 1 and the output circuit is in the fourth state.

2. The combiner latch circuit according to claim 1, wherein the output circuit is further configured to keep its current state when the first input is at logic 1 and the second input is at logic 1 and the clock input encounters a trailing edge from logic 1 to logic 0.

3. The combiner latch circuit according to claim 1, wherein the inverted clock input is connected to the clock input, via an inverter circuit.

4. The combiner latch circuit according to claim 1, comprising:
   a first and a second branch connected in parallel between a supply voltage terminal and a ground terminal, wherein each of the first branch and the second branch comprises:
      a Positive Metal Oxide Semiconductor (PMOS) transistor having a gate connected to a terminal for an inverted clock signal, and a source connected to the supply voltage terminal;
      a first Negative Metal Oxide Semiconductor (NMOS) transistor arranged downstream the PMOS transistor;
      a second NMOS transistor arranged downstream the first NMOS transistor, and
      a third NMOS transistor arranged downstream the second NMOS transistor with a source thereof connected to the ground terminal, and a gate connected to a terminal for a clock signal; and wherein the combiner latch circuit further comprises:
a first terminal connected to the gate of the second NMOS transistor of the first branch;
a second terminal connected to a gate of the second NMOS transistor of the second branch;
a cross-coupling of the first NMOS transistors of the first branch and the second branch, wherein
a gate of the first NMOS transistor of the first branch connected to the drain of the first NMOS transistor of the second branch; and
a gate of the first NMOS transistor of the second branch connected to the drain of the first NMOS transistor of the first branch;
wherein an input circuit comprises the PMOS transistors, the second NMOS transistors, and the third NMOS transistors of the first branch and the second branch; and
wherein an output circuit comprises the cross-coupled first NMOS transistors and the differential terminals connected to a drain of the first NMOS transistor of the first branch and the second branch, respectively.

5. The combiner latch circuit according to claim 4, wherein the PMOS transistor of the first and the second branch is a single PMOS transistor, common to the first and the second branch, with a gate connected to the clock signal input and a source connected to the supply voltage terminal and the drain connected to the first branch and the second branch of the output circuit.

6. The combiner latch circuit according to claim 4, wherein the third NMOS transistor of the first and the second branch is a single NMOS transistor, common to the first and the second branch, with a gate connected to the clock signal input and a drain connected to the first branch and the second branch and the source connected to the ground terminal.

7. The combiner latch circuit according to claim 1, comprising:
a first and a second branch connected in parallel between a supply voltage terminal and a ground terminal, wherein each of the first branch and the second branch comprises:
a first Positive Metal-Oxide Semiconductor (PMOS) transistor having a gate connected to a terminal for an inverted clock signal, and a source connected to the supply voltage terminal;
a second PMOS transistor arranged downstream the first PMOS transistor;
a first Negative Metal Oxide Semiconductor (NMOS) transistor arranged downstream the second PMOS transistor, and
a second NMOS transistor arranged downstream the first NMOS transistor with a source thereof connected to the ground terminal, and a gate connected to a terminal for a clock signal; and wherein the combiner latch circuit further comprises:
a first terminal connected to the gate of the second PMOS transistor of the first branch;
a second terminal connected to a gate of the second PMOS transistor of the second branch;
a cross-coupling of the first NMOS transistors of the first branch and the second branch, wherein
a gate of the first NMOS transistor of the first branch connected to the drain of the first NMOS transistor of the second branch; and
a gate of the first NMOS transistor of the second branch connected to the drain of the first NMOS transistor of the first branch;
wherein an input circuit comprises the first PMOS transistors, the second PMOS transistors, and the second NMOS transistors of the first branch and the second branch; and
wherein an output circuit comprises the cross-coupled first NMOS transistors and the differential terminals connected to a drain of the first NMOS transistor of the first branch and the second branch, respectively.

* * * * *